United States Patent [19]
Rodier

[11] Patent Number: 5,931,629
[45] Date of Patent: Aug. 3, 1999

[54] AUTOMATIC INPUT AND OUTPUT TUBE HANDLERS FOR USE WITH AN ELECTRONIC COMPONENT PROCESSING EQUIPMENT

[75] Inventor: Sylvain Rodier, Longueuil, Canada

[73] Assignee: Corfin Inc., Chambly, Canada

[21] Appl. No.: 08/880,172

[22] Filed: Jun. 20, 1997

[30] Foreign Application Priority Data

Apr. 15, 1997 [CA] Canada .................................. 2202788

[51] Int. Cl.$^6$ ...................................................... B65G 1/08
[52] U.S. Cl. .............................. 414/413; 53/235; 29/741; 221/11; 209/573; 414/403; 414/417; 414/421; 414/414; 414/797.9
[58] Field of Search ..................................... 414/403, 417, 414/404, 413, 418, 797.9, 421, 415, 414; 53/235, 531, 537; 29/741, 564.1; 209/573; 221/11

[56] References Cited

U.S. PATENT DOCUMENTS

| | | | |
|---|---|---|---|
| 4,194,865 | 3/1980 | Bandoh | 414/403 |
| 4,599,026 | 7/1986 | Feiber et al. | 414/413 X |
| 4,629,387 | 12/1986 | Stillman et al. | 414/421 X |
| 4,647,269 | 3/1987 | Wedel et al. | 414/403 X |
| 4,760,924 | 8/1988 | Sato et al. | 414/403 X |
| 4,761,106 | 8/1988 | Brown et al. | 414/413 X |
| 5,328,317 | 7/1994 | Masul et al. | 414/403 |

FOREIGN PATENT DOCUMENTS

| | | |
|---|---|---|
| 1256323 | 6/1989 | Canada . |
| 197518 | 10/1985 | Japan ..................................... 414/413 |
| 140419 | 6/1986 | Japan ................................... 414/797.9 |
| 203028 | 9/1986 | Japan ................................... 414/797.9 |
| 74836 | 4/1987 | Japan ..................................... 414/403 |

*Primary Examiner*—Frank E. Werner
*Attorney, Agent, or Firm*—ROBIC

[57] ABSTRACT

A fully automatic device is provided for handling components-containing tubes and for feeding the components contained in these tubes into the input rail or "accumulator" of the loading area of a component processing equipment. Another fully automatic device which is very similar in structure to the above device is also provided for recovering the components from the output rail of the unloading area of the component processing equipment, and reinserting such components into their tubes. Both of these devices have a column holder mounted on a frame for receiving and holding a column of tubes stacked one above the other. A rotatable barrel having a conical shape and a horizontal axis supports a set of tube catching assemblies. A motor rotates the barrel to position successively each of the tube catching assemblies horizontally just in front of the bottom end of the column holder to pick up one of the tubes of the column holder, which is pushed forwards by a pusher mechanism, and then to move the catching assembly and tube held by the same up to a vertical, inclined position where the tube extend in line with the loading or unloading area of the equipment and can be emptied or filled up with components. An ejecting system pushes the emptied or filled tubes out of the barrel and into a chute. Such devices are very efficient and may easily handle up to 45,000 electronic components per hour.

8 Claims, 17 Drawing Sheets

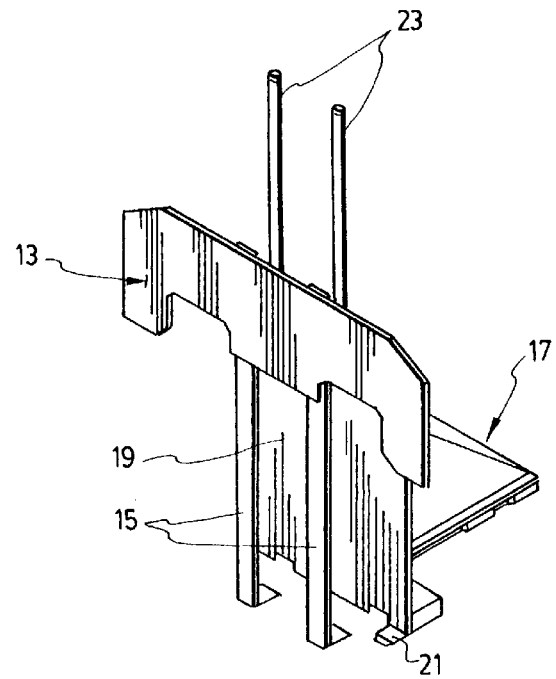
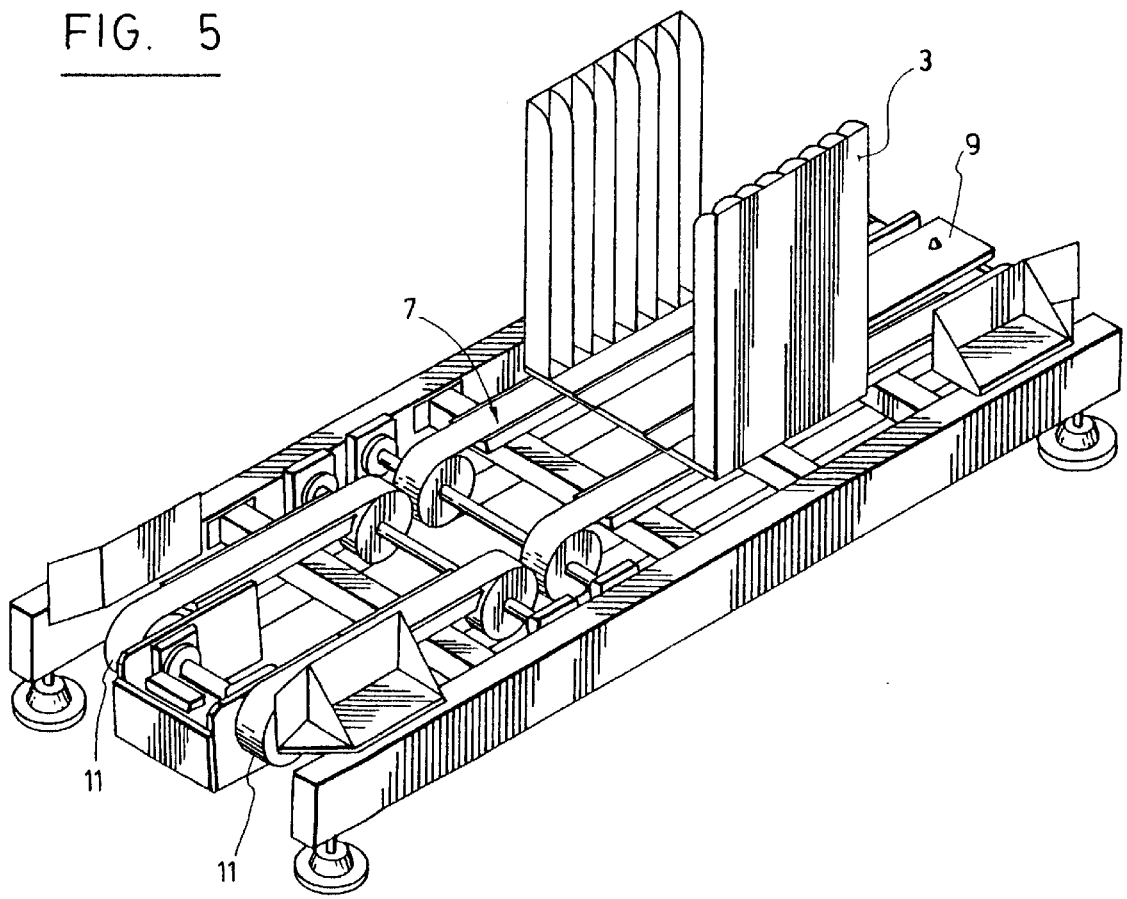
FIG. 5

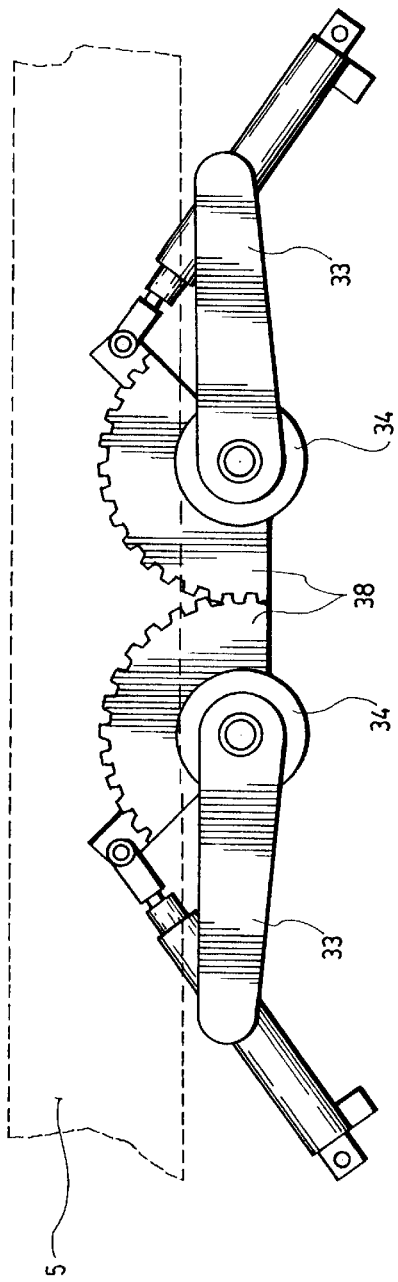
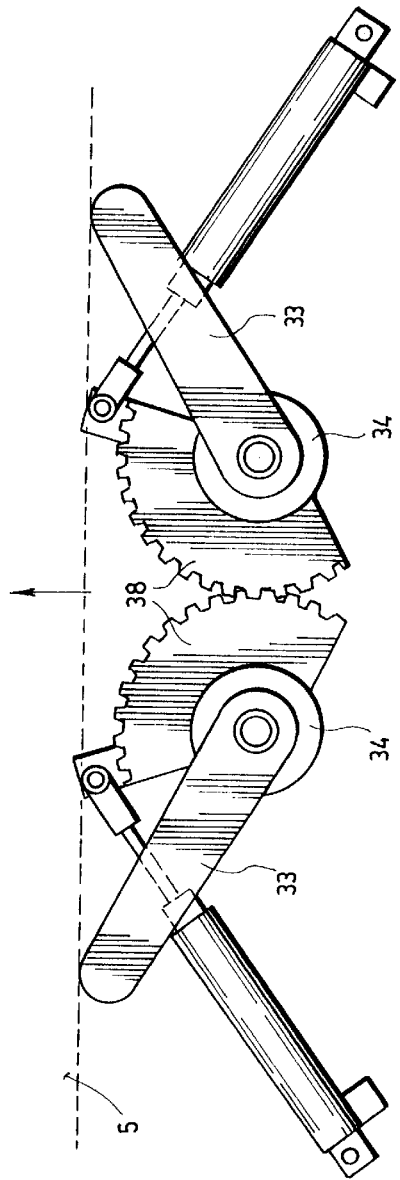

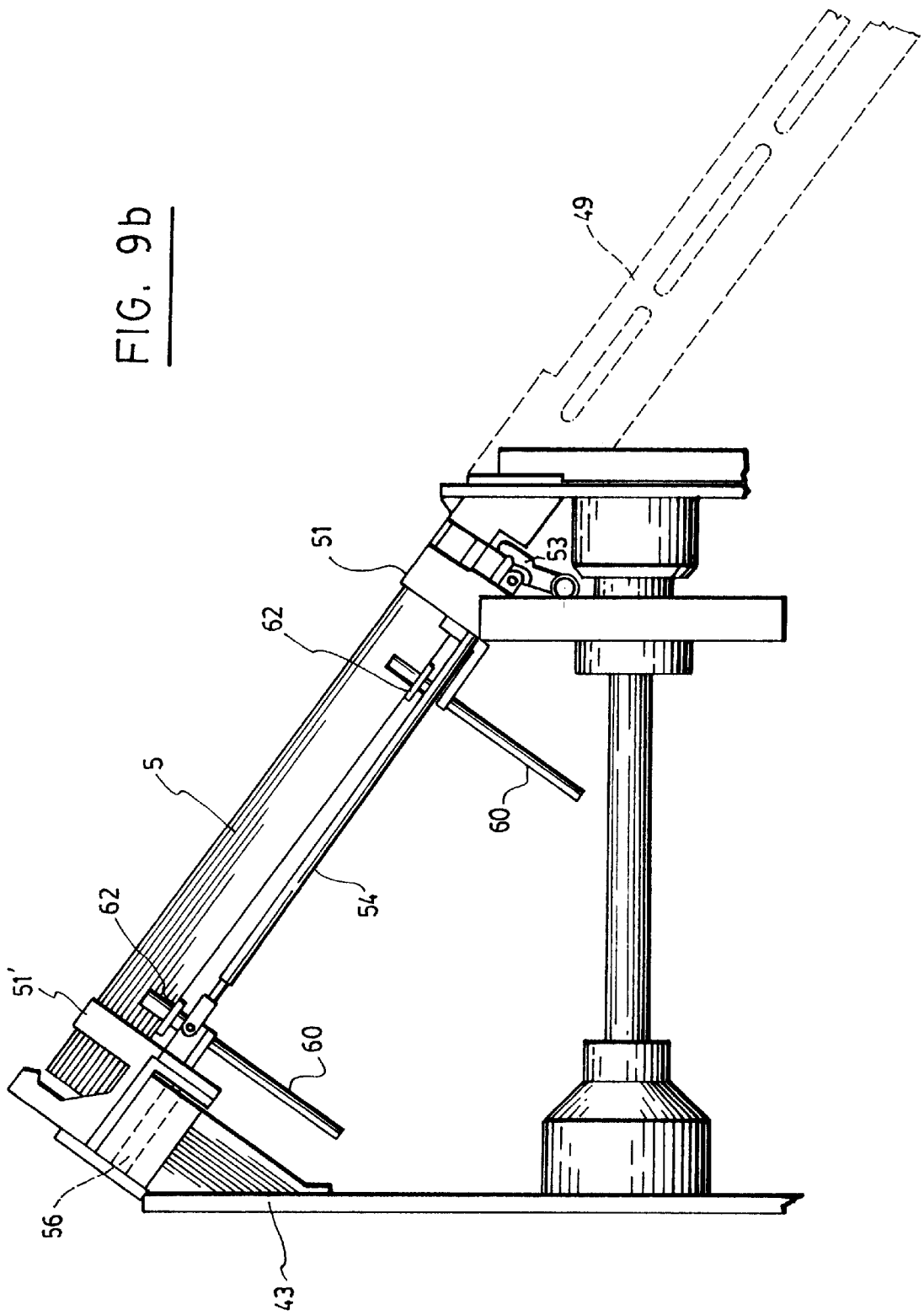

AUTOMATIC INPUT AND OUTPUT TUBE HANDLERS FOR USE WITH AN ELECTRONIC COMPONENT PROCESSING EQUIPMENT

FILED OF THE INVENTION

The present invention relates to an automatic device for feeding components stored in tubes into the loading area of a component processing equipment.

It also relates to an automatic device for recovering the components from the unloading area of the component processing equipment and reinserting them into the storing tubes.

In the following description and claims, the word "components" designates any kind of components that must be processed before use. It more particularly applies to electronic components like transistors (TO's) or dual in line packages (DIP'S), whose leads must be tinned to prevent soldering effects. Similarly, the expression "component processing equipment" includes any kind of equipment or system in which the above components are conveyed and processed in line.

BRIEF DESCRIPTION OF THE PRIOR ART

In the electronic industry, components such as TO's, must have their metal leads "tinned" to prevent soldering defects before they are installed on or in an electronic circuit. This process is well known in the art an essentially consists in covering the leads with a hot solder coating to thereby assure the solderability of the leads and reduce defects and reworks.

A number of systems have been devised for carrying out this process in line, in a fully automated manner. An example of such a system is disclosed in Canadian patent No. 1,256,323 issued in 1989 and assigned to the present Applicant. Another example of such a system provided with improved gripping means, is disclosed in Canadian patent application No. 2,174,076 filed in 1996 in the name of the present Applicant.

In use, the TO's to be tinned are stored into elongated plastic tubes and slid out of such tubes into an inclined input rail also called "accumulator", which brings them down to the conveyor of the tinning machine where they can be picked up and processed. After tinning, the TO's are released from the conveyor into an inclined output rail and then reinserted into similar plastic tubes for further handling and storage.

Usually, the tubes are handled manually to feed the components into the accumulator and recover these components from the output rail.

To speed up the proceeding, Canadian patent No. 1,256, 323 discloses a semi-automatic feeding system for handling the tubes at the loading area of the tinning machine and feeding the components contained in the tubes into the accumulator (see FIGS. 5 to 7 of the patent).

This system makes use of cartridges of tubes stacked up one above the other. A chain conveyor and a pair of cylinders bring each tube of each cartridge into alignment with the inlet of the accumulator such that the components in the tube may be discharged. Following emptying of all the tubes of a cartridge, one of the cylinders is activated to move the empty tubes and cartridge and let room for another full cartridge whose tubes are to be emptied.

A similar recovering system is also used at the unloading area of the tinning machine, to recover the components from the inclined output rail and reinsert them into their plastic tubes.

If the component-feeding and recovering systems disclosed in this patent are efficient, they are definitively not fast enough for a proper use with tinning machines like the one disclosed in Canadian patent application No. 2,174,076, which can process up to 43,000 TO's per hour (26,000 in the case of TO-247; 43,000 in the case of TO-220).

SUMMARY OF THE INVENTION

An object of the present invention is to provide a fully automatic device hereinafter called "automatic input tube handler" for handling component-containing tubes and for feeding the components contained in these tubes into the input rail or "accumulator" of the loading area of a component processing equipment.

Such a device is very efficient and may easily handle up to 45,000 electronic components per hour.

Another object of the invention is to provide a fully automatic device hereinafter called "automatic output tube handler", which is very similar in structure to the above-mentioned input tube handler. This output tube handler is devised to recover the components from the output rail of the unloading area of the component processing equipment, and reinsert such components into their tubes.

Both of these automatic input and output tube handlers have the same basic structural elements and work in substantially the same way. More particularly, both of them comprise:

a column holder mounted on a frame for receiving and holding a column of tubes stacked one above the other;

a rotatable barrel of conical shape and horizontal axis supporting a set of tube catching assemblies;

a motor for rotating the barrel to position successively each of the tube catching assemblies horizontally just in front of the bottom end of the column holder to pick up one of the tubes of the column holder, which is pushed forwards by a pusher mechanism, and then to move the catching assembly and tube held by the same up to a vertical, inclined position where the tube extends in line with the loading or unloading area of the equipment and can be emptied or filled up with components;

a chute adjacent to the barrel and opposite to the column holder and an ejecting system for pushing out of the barrel and into the chute, the tubes after they have been emptied or filled up; and a clamping system for preventing components from sliding down while the barrel is rotating; and a control system.

More specifically, the input tube handler according to the invention is intended to be used for feeding components stored in tubes into a loading area of a component processing equipment, each of the tubes being straight and having a longitudinal axis and an open end.

This input tube handler comprises a frame and a column holder mounted on the frame for receiving and holding a column of tubes stacked one above the other with all their open ends on a same side of the column, each of the tubes extending horizontally and being filled with components to be fed into the loading area.

The column holder has a front side, a rear side and a bottom end.

The input tube handler also comprises a rotatable barrel having a conical shape and an apex and comprising an axle spindle supporting a set of tube catching assemblies extending along generating lines of the conical barrel. The tube catching assemblies are equally spaced apart around the barrel and comprise holding blocks provided with radially outwardly opened slots. The barrel is mounted on the frame close to the rear side of the column holder so that the axial spindle extends horizontally and each of the tube catching assemblies moving towards the column holder when the barrel is rotated, passes through a loading position parallel and adjacent to the bottom end of the column holder.

A motor is operatively connected to the spindle for rotating the barrel to position successively each of the tube catching assemblies in the horizontal loading position just in front of the bottom end of the column holder and then to move up the catching assembly to a vertical, inclined position.

The input tube handler further comprises a tube pusher mechanism for pushing forwards the tube of the column of tubes extending at the bottom end of the column holder into the slots of the holding blocks of the tube catching assembly that has just been moved in the loading position, with the open end of this tube extending close to the apex of the conical barrel.

A clamping system is provided for closing at least in part the open ends of the tubes that are hold by the tube catching assemblies so as to prevent the components from sliding out of the tube in which they are stored when the barrel is rotated and the catching assemblies and tubes hold by the assemblies are moved up.

The input tube handler still comprises:
 a chute mounted on the frame close to the barrel and opposite to the column holder for collecting the tubes from the tube catching assemblies after these tubes have been emptied and the barrel is further rotated to bring the tube catching assemblies to an unloading position.
 an ejecting system operatively mounted on the barrel to push the tubes out of the slots of the tube catching assemblies into the chute when the tubes reach this chute; and
 a control system for actuating the motor, the tube pusher mechanism, the clamping system and the ejecting system sequentially so that each of the stacked tubes hold in the column holder is caught by one of the tube catching assemblies, then moved to the vertical inclined position and finally ejected into the chute.

From a practical standpoint, the frame and barrel must have a size, shape and position adapted to the size of the component processing equipment so that, in the vertical, inclined position, the open end of the inclined tube that is in a lower position, extends just in front of, and in line with, the loading area of this equipment, and the clamping system is then actuated to let the components stored in the inclined tube slide down by gravity into this loading area.

On the other hand, the output tube handler according to the invention is intended to be used for recovering components from an unloading area of a component processing equipment and for inserting the so-recovered components into tubes that are straight and each has a longitudinal axis and an open end.

Once again, this output tube handler comprises a frame and a column holder mounted on the frame for receiving and holding at least one column of tubes stacked one above the other with all their open ends on a same side of the column, each of the tubes extending horizontally and being empty. The column holder has a front side and a bottom end.

The output tube handler also comprises a rotatable barrel having a conical shape and an apex and comprising an axle spindle supporting a set of tube catching assemblies extending along generating lines of the conical barre. The tube catching assemblies are equally spaced apart around the barrel and comprise holding blocks provided with radially outwardly opened slots. The barrel is mounted on the frame close to the rear side of the column holder so that the axial spindle extends horizontally and each of the tube catching assemblies moving towards the column holder when the barrel is rotated, passes through a loading position parallel and adjacent to the bottom end of the column holder.

A motor is operatively connected to the spindle for rotating the barrel to position successively each of the tube catching assemblies in the horizontal loading position just in front of the bottom end of the column holder and then to move up the catching assembly to a vertical, inclined position.

The output tube handler further comprises a tube pusher mechanism for pushing forwards the tube of the column of tubes extending at the bottom end of the column holder into the slots of the holding blocks of the tube catching assembly that has just been moved in the loading position, with the open end of the tube extending opposite to the apex of the conical barrel.

The output tube handler still comprises:
 a chute mounted on the frame close to the barrel and opposite to the column holder for collecting the tubes from the tube catching assemblies after the tubes have been emptied and the barrel is further rotated to bring the tube catching assemblies to an unloading position;
 an ejecting system operatively mounted on the barrel to push the tubes out of the slots of the tube catching assemblies into the chute when the tubes reach the chute; and
 a control system for actuating the motor, the tube pusher mechanism, the clamping system and the ejecting system sequentially so that each of the stacked tubes hold in the column holder is caught by one of the tube catching assemblies, then moved to the unloading position and finally ejected into the chute.

Once again, the frame and barrel must have a size, shape and position adapted to the size of the component processing equipment so that, in the vertical inclined position, the end of the inclined tube that is in an upper position, extends just in front of, and in line with, the unloading area of the equipment and the components coming from the unloading area are then free to slide down by gravity into the inclined tube and fill it up.

The invention, its operation and its advantages will be better understood upon reading the following description of a preferred embodiment thereof, made with reference to the accompanying drawings:

BRIEF DESCRIPTION OF THE DRAWINGS

FIG. 5 is a perspective view similar to the one of FIG. 4, showing the column elevator in its upper position;

FIGS. 7d to 7e are top plan views of the tube pusher mechanisms, in two different operative positions;

DESCRIPTION OF TWO PREFERRED EMBODIMENTS OF THE INVENTION

Figure 1:
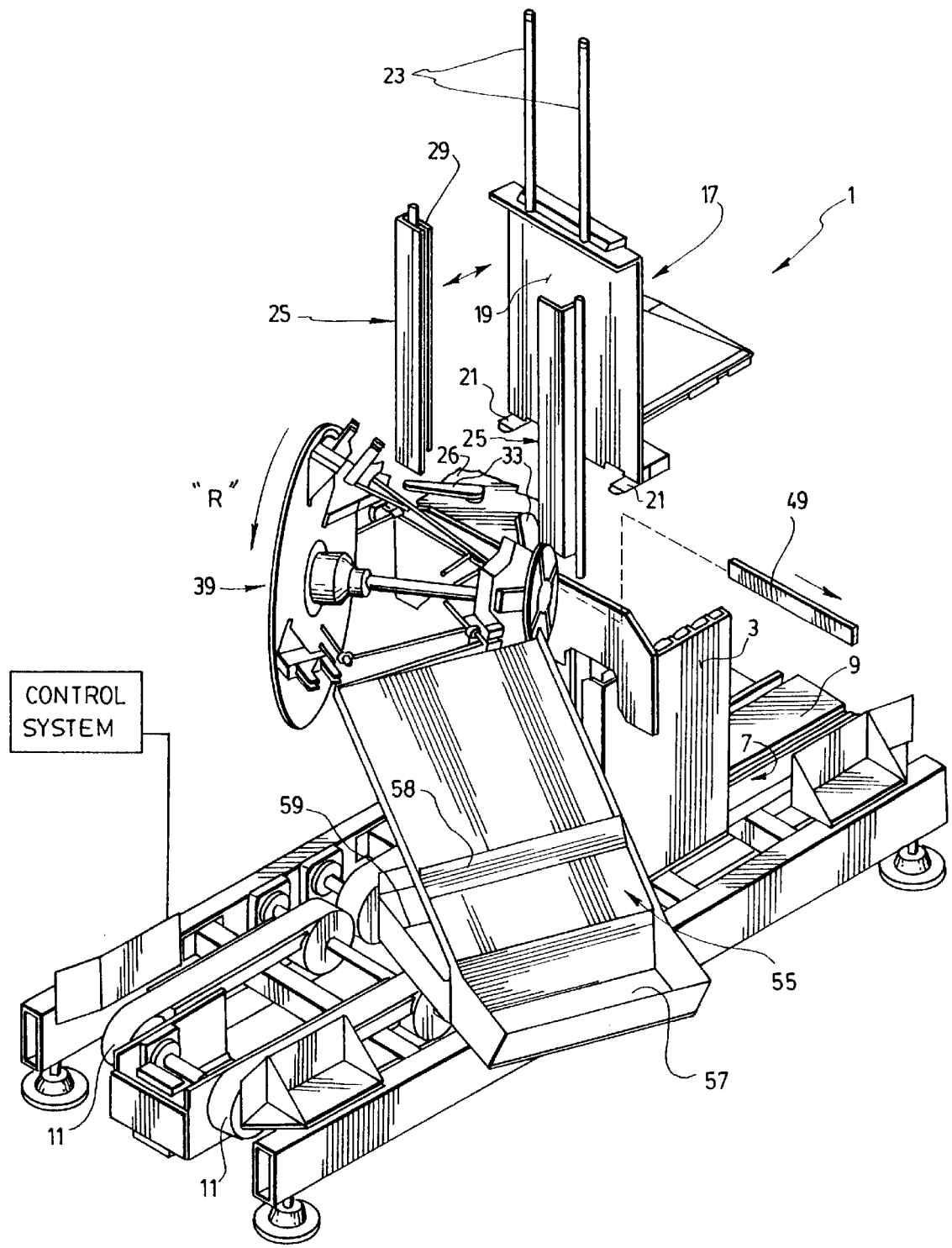
FIG. 1 is a schematic semi-exploded perspective view showing the main elements of an automatic input tube handler according to a preferred embodiment of the invention.

FIGS. 1 to 10 illustrate an automatic input tube handler 1 according to a preferred embodiment of the invention. This input tube handler 1 is intended to be used to feed components stored in tubes 5 (see FIGS. 3, 9b and 9c) into the loading area of a component processing machine (not shown). Each of the tubes 5 is straight and has a longitudinal axis "A". Each of the tubes 5 also has an open end 6 to allow insertion and removal of components to and from it, respectively. This kind of tube is conventionally used in the electronic industry for storing and handling electronic components. Accordingly, it needs not be further described.

A multi-column magazine 3 hereinafter called "MCM" (see FIGS. 3 to 6 and 7) and a trolley (not shown) are used to transport and deliver columns of tubes stacked on above the other and loaded with components to the automatic input handler 1. The columns of tubes 5 that are so transported extend vertically and in parallel relationship, with the open ends 6 of all the tubes on a same side. The MCM can be attached to the trolley by two tapered locating pins. The trolley can then be wheeled to a loading end of a magazine conveyor 7 that is part of the input tube handler 1.

A loading dock elevator 9 is provided at the loading end of the conveyor to lift the MCM 3 from the trolley and thus facilitate transfer of the MCM from the trolley to the magazine conveyor. A sensor and a light (not shown) indicate when the trolley can be removed. Once the trolley is removed, the loading dock, elevator 9 lowers the MCM onto the magazine conveyor 7 when the previous MCM that may have been fed into the input tube handler, has been unloaded and raised off of the magazine conveyor by an unloading dock elevator 11 located at the other, unloading end of the magazine conveyor 7. If there is no other MCM present, the loading dock elevator 9 will proceed to lower the MCM immediately onto the magazine conveyor.

The magazine conveyor 7 moves the MCM 3 loaded on it from the loading dock elevator 9 to a column elevator 13 that extends transversally to the conveyor (see FIGS. 4 to 6 and 7). Once the MCM is emptied, the magazine conveyor 3 moves the empty MCM to the unloading dock elevator 11.

The column elevator 13 comprises an integral fork 15 movable up and down for picking up one by one each of the columns of tubes 5 contained in the MCM 3 for lifting it up to a support assembly 17. The column elevator then returns downward to its original position adjacent the magazine conveyor 3, which is then actuated so the MCM 3 can be advanced in order to bring the next column of stacked tubes to the column elevator 13 and have this next column lifted up.

Figure 2:
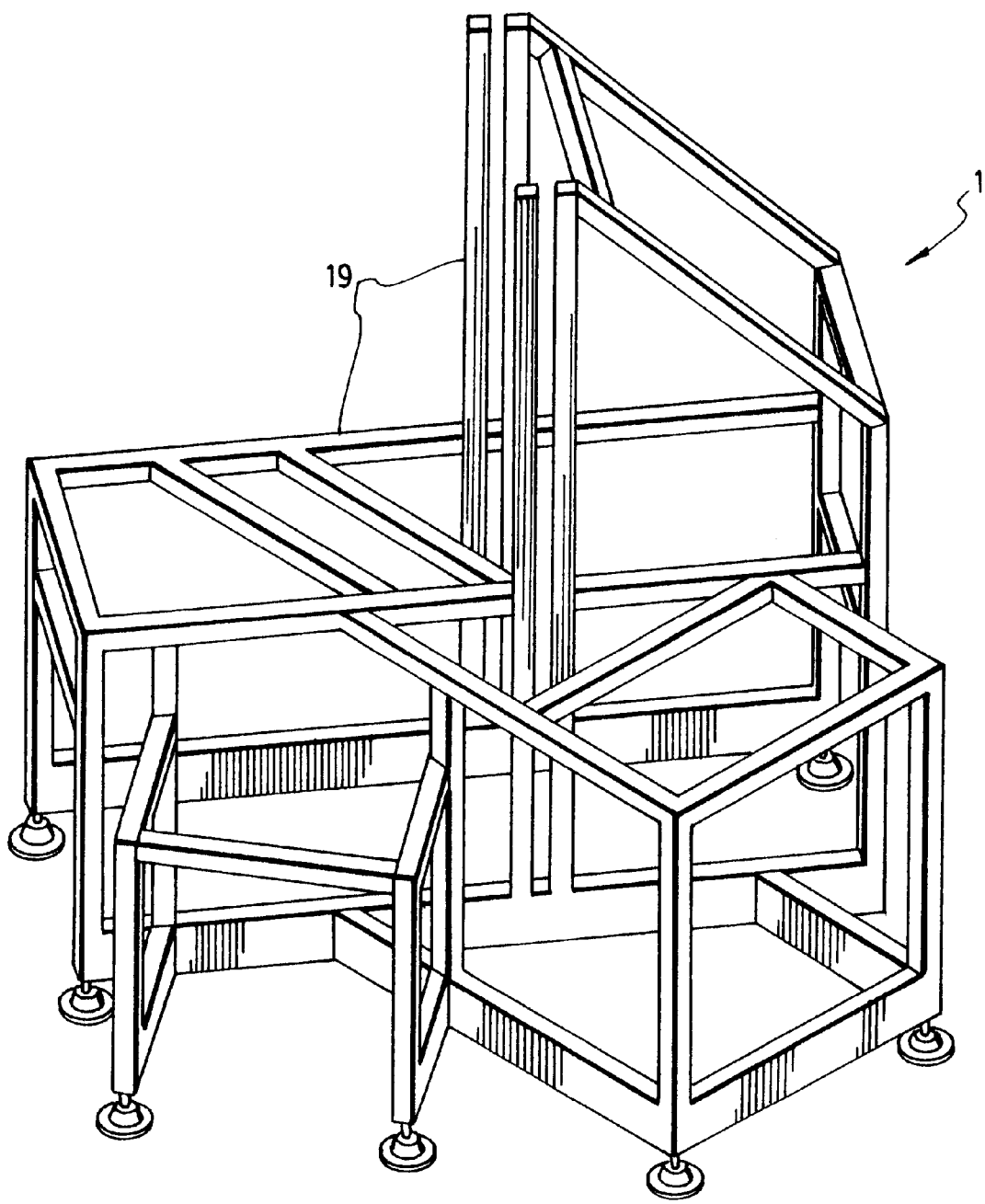
FIG. 2 is a perspective view from another angle of the frame used to hold the elements of the input tube handler shown in FIG. 1.
Figure 3:
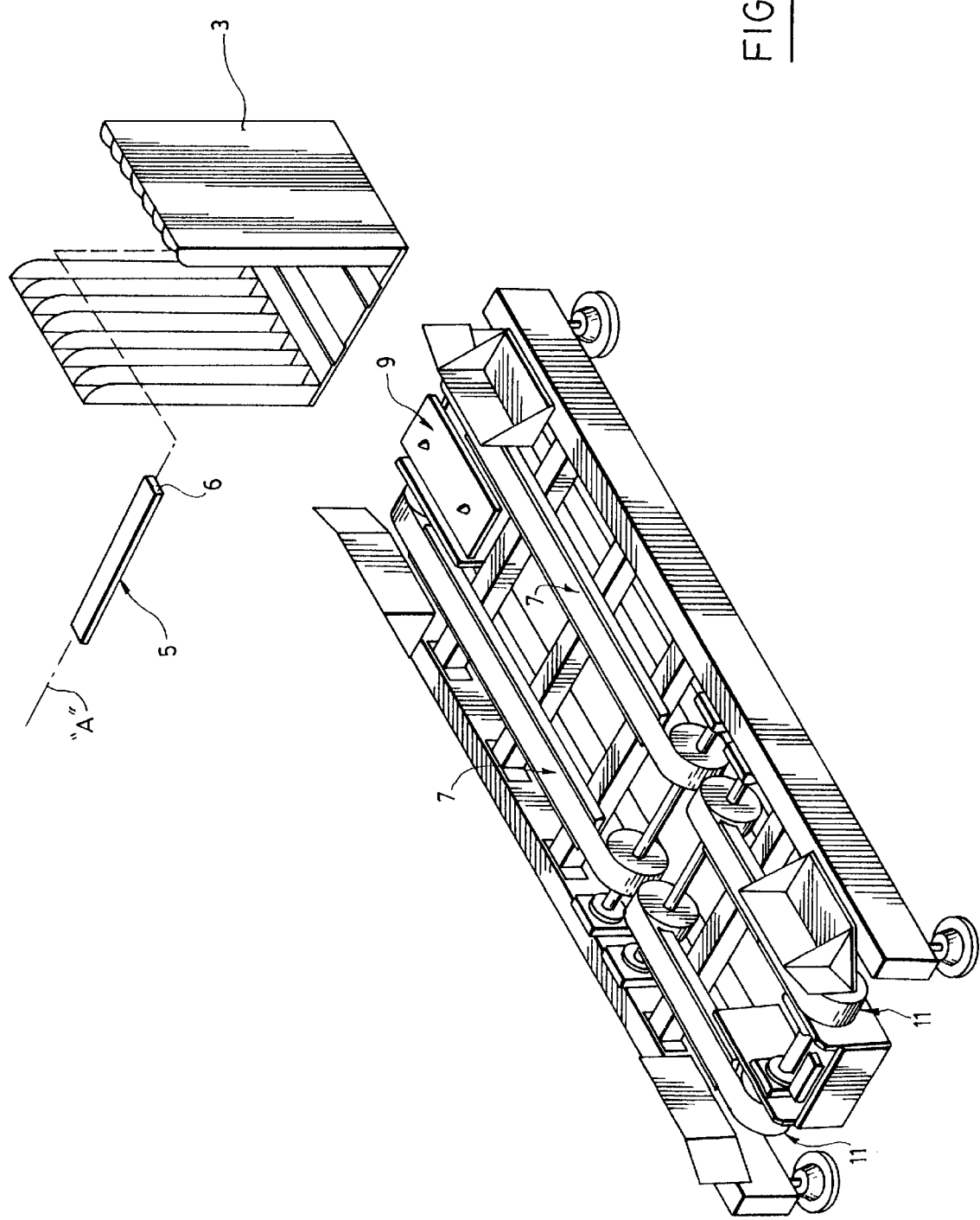
FIG. 3 is a perspective view of the multi-column magazine conveyor of the input tube handler of FIG. 1, showing a multi-column magazine (MCM) in preloading position.

All the above-mentioned structural elements of the input tube handler 1, as well as all the other elements that will be described hereinafter, are operatively mounted onto a supporting frame 19 which is better shown in FIG. 2.

The support assembly 17 is mounted on the frame and connected to suitable actuating means so as to be movable forwards and rearwards for picking up the column lifted up by the column elevator 13 and bringing into a column holder 25 that will be described in greater detail hereinafter.

As is better shown in FIGS. 4 to 6 and 8, the support assembly 17 comprises a pusher plate 19 that extends vertically and transversally with respect to the magazine conveyor above the same. The support assembly 17 also comprises two holding plates 21 located at the bottom of the pusher plate 19 for retaining the column of tubes lifted by the column elevator with the column extending flat against the pusher plate 19, and thus for allowing the column elevator to move down and pick up another column of tube. The holding plates 21 are preferably retractable to allow the column of tubes to slide against the pusher plate while it is lifted up. Two air-actuated cylinders 23 are mounted onto the support assembly 17 for such a manner that their piston rods extend downwardly and parallel to the pusher plate toward the holding plates 21.

Figure 4:
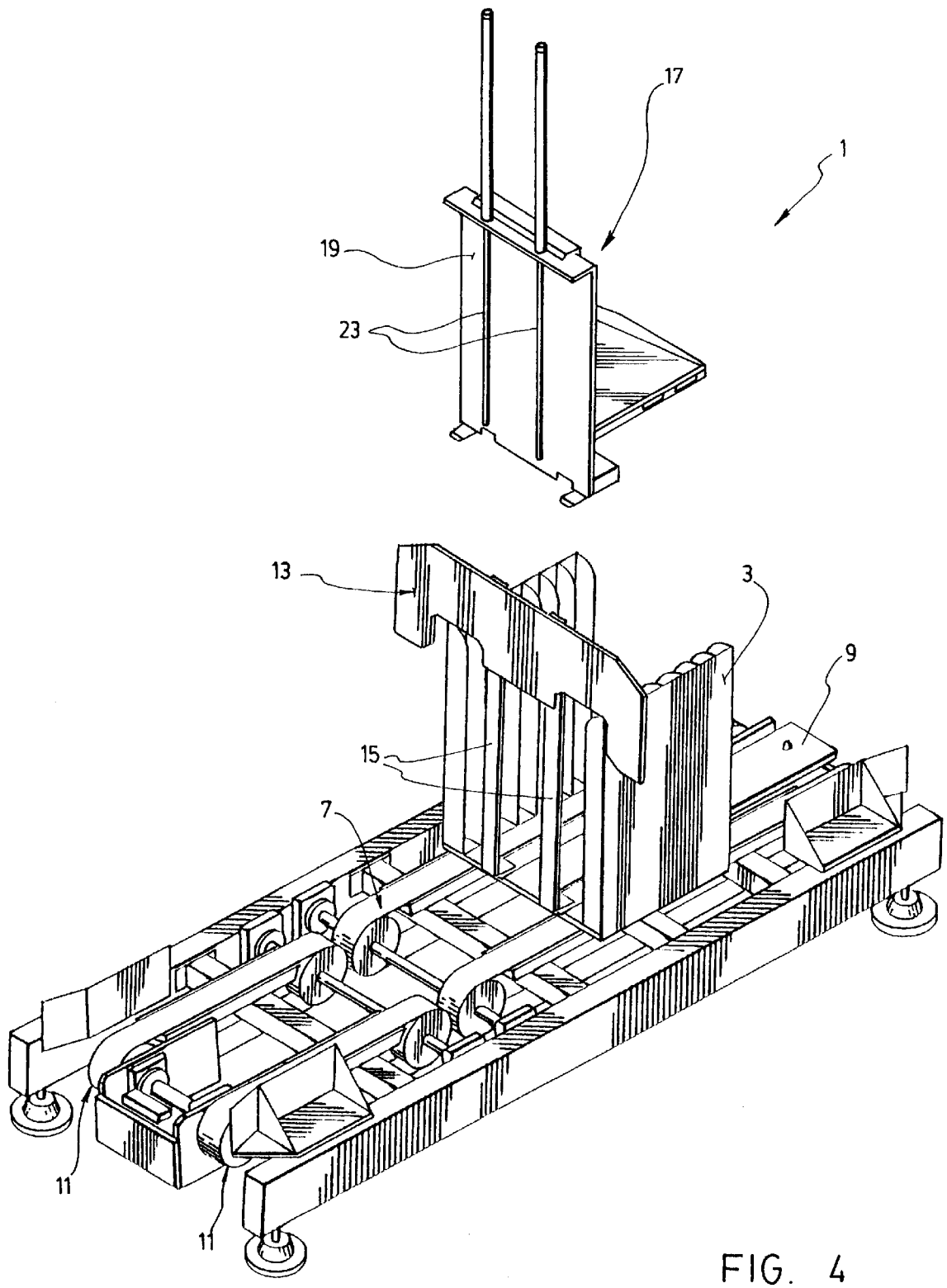
FIG. 4 is a perspective view showing the column elevator in its lower position where it can pick up a column of tubes from the MCM, this view also showing the pneumatic support assembly that holds the tubes of the column after they have been lifted up.
Figure 6:
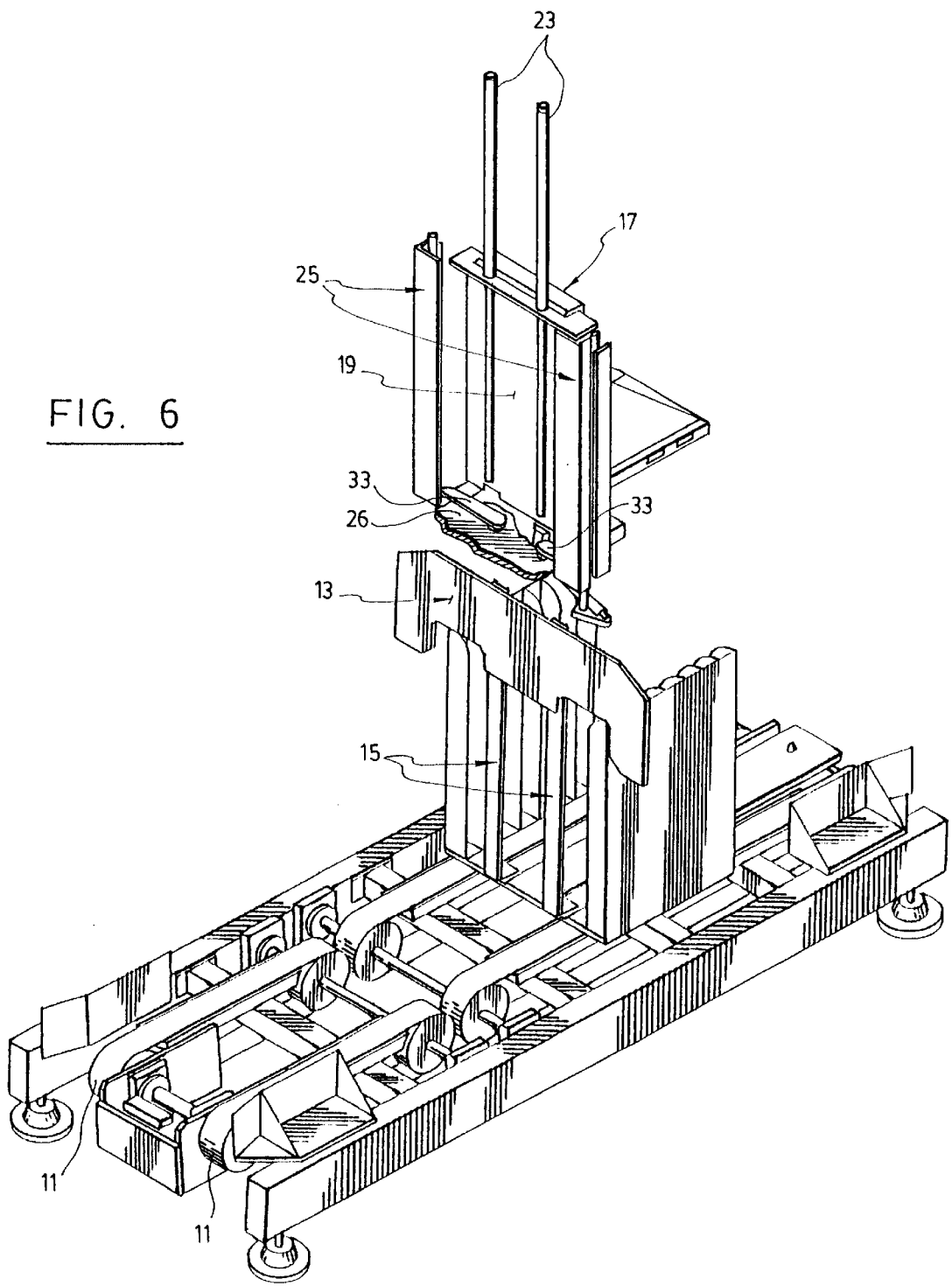
FIG. 6 is a perspective view similar to the one of FIG. 5, but additionally showing the column holder and the tube pushed mechanism that are essential elements of the input tube handler according to the invention.

When the column elevator 13 lifts up with its forks 15 a column of stacked tubes toward the support assembly 17, the holding plates 21 are retracted, as is shown in FIG. 4, to give room to the column and let it move up along the pusher plate 19. Once the column elevator 13 has reached its top position (see FIG. 5), the holding plates 21 are extended under each end of the column of tubes to hold the tubes up. Then, the cylinders 23 are actuated so that their piston rods 23 move down and press onto the top of the column of tubes to keep them stacked in place. The column elevator 13 can then be lowered to pick up a next column of tubes form the MCM, as was already explained hereinabove.

After having been loaded with a column of tubes, the support assembly 17 is moved forward to bring the column of tubes that it holds, into the column holder 25, which is shown in FIGS. 1, 6, 7a to 7c and 8 and whose purpose is to hold the tubes while they are supplied one by one to a rotatable barrel 39.

Figure 7A:
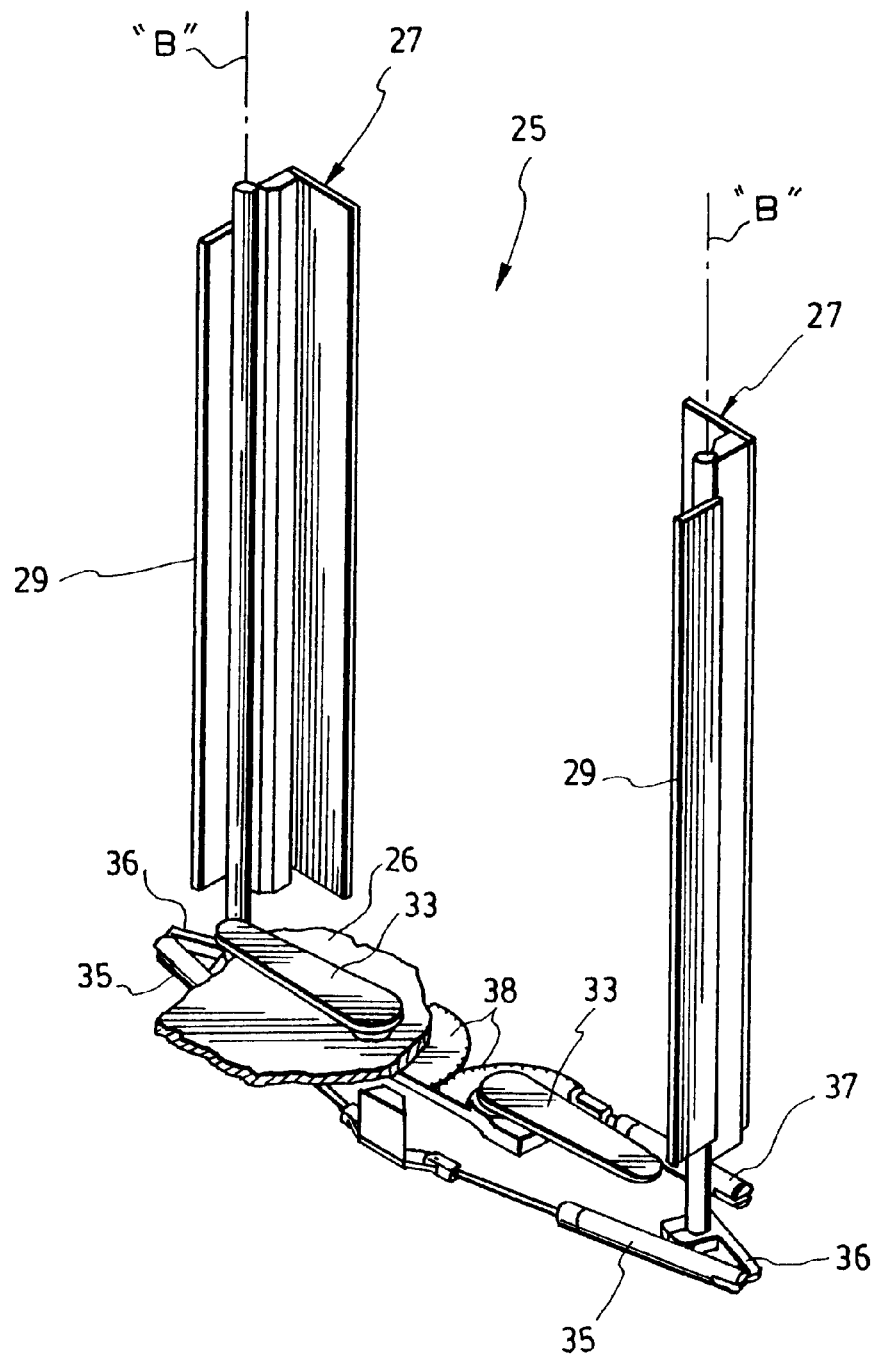
FIGS. 7a to c are perspective views of the column holder and the tube pusher mechanism shown in FIG. 6, in different operative positions.
Figure 7B:
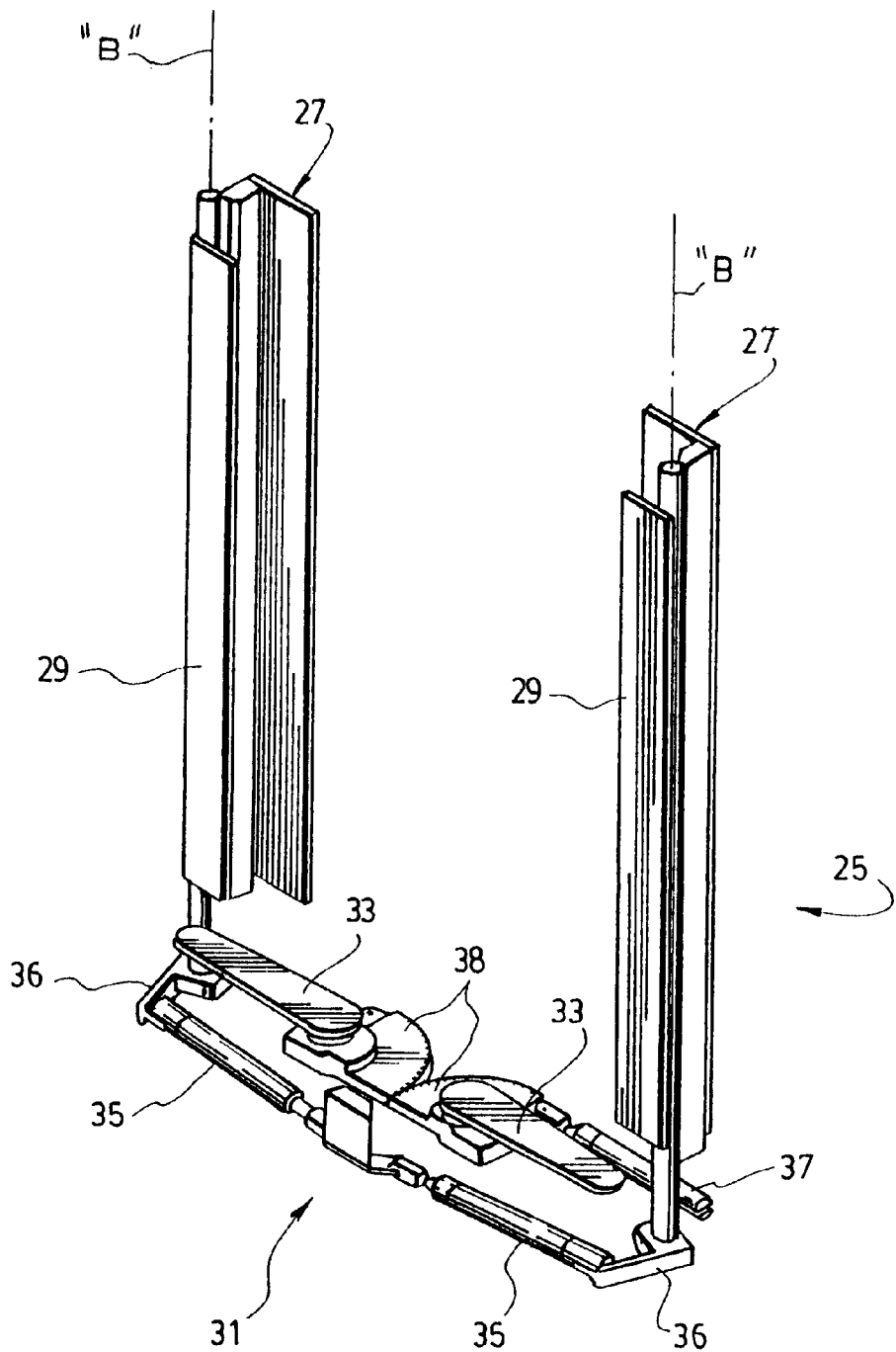
Figure 7C:
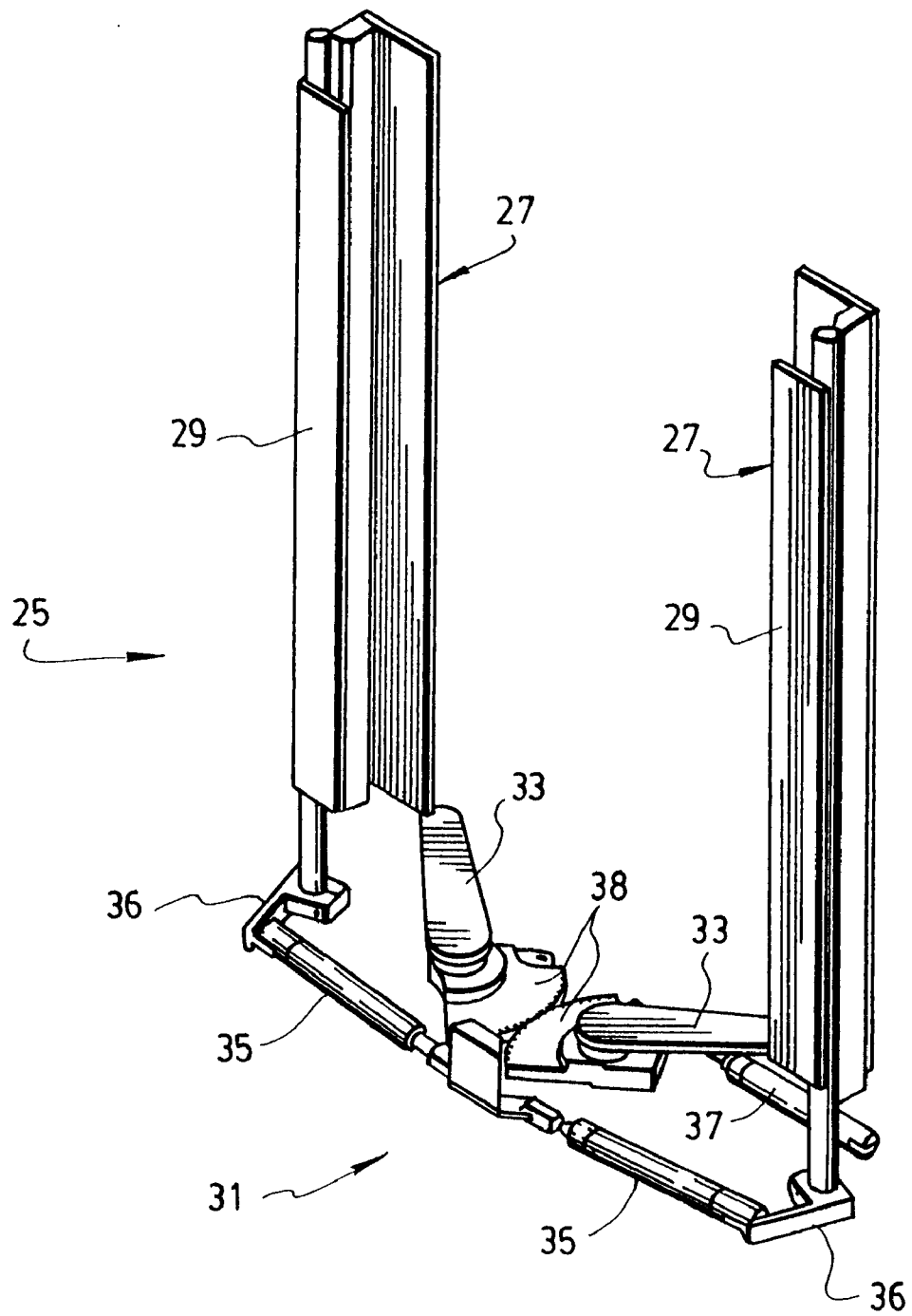
Figure 8:
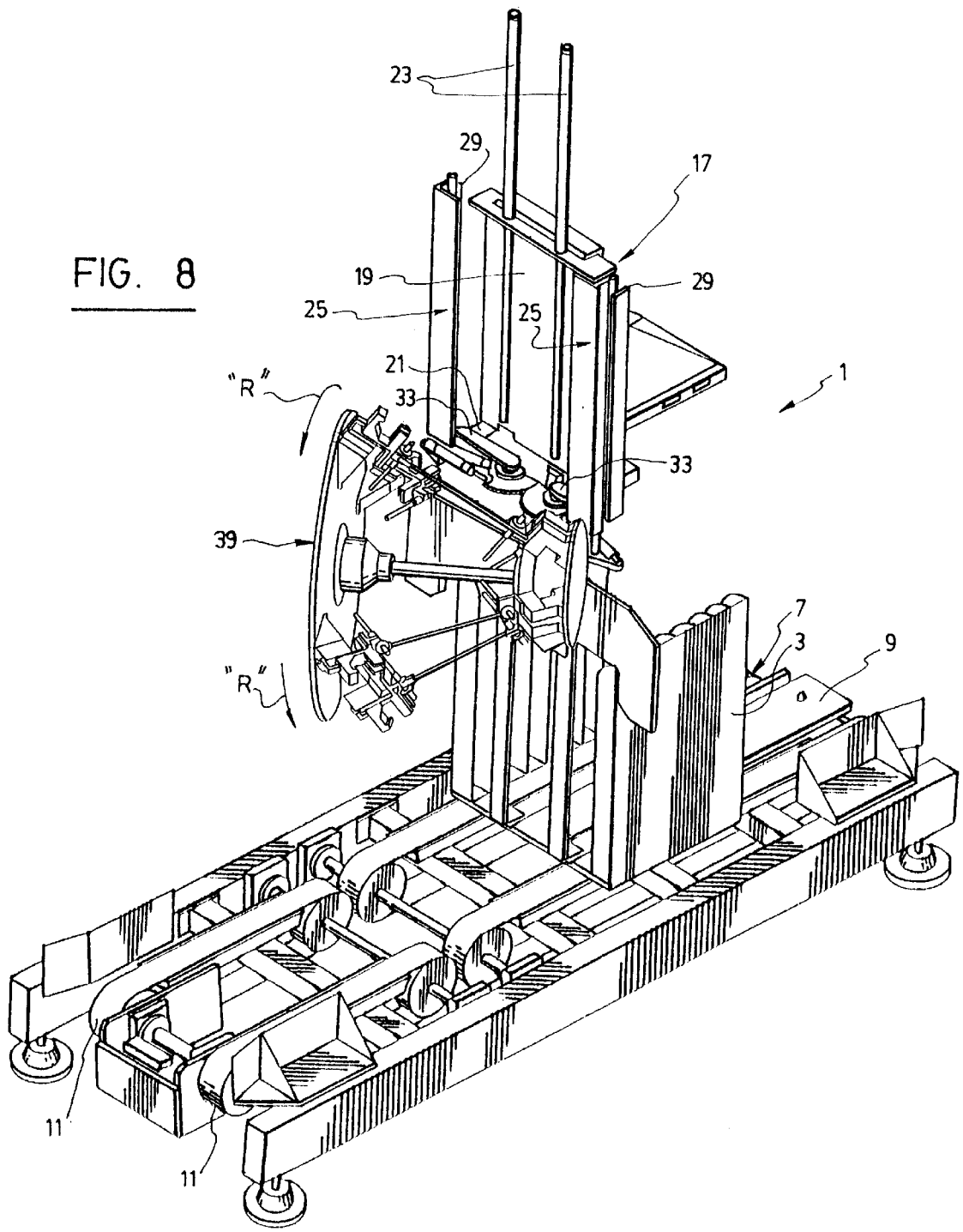
FIG. 8 is a perspective view similar to FIG. 6, but additionally showing the barrel of the input tube handler according to the invention, in operative position.

As is better shown in FIGS. 1, 6 and 7a to 7c, the column holder 25 comprises an horizontal base 26 and two vertical members 27 each of U-shaped cross-section that are spaced apart to receive in between the column of tube brought by the support assembly 17. Each member 27 having a rear wall 29 in the form of a retaining plate pivotable amount a vertical axis B. These retaining plates extend on the front side of the column holder so as to be adjacent to the pusher plate 9. They act as a column locking mechanism and are operatively connected to actuating means so as to swing between an open position where the support assembly may move forward and bring the column of tubes in between the vertical members, and a closed position where the column of tubes is locked. As is better shown in FIGS. 7a to 7c, the actuating mechanism of the retaining plates 29 comprises two cylinders 35 each connected to an actuating lower 36 projecting from the axis B. When actuated, these cylindrical open and close the retaining plates 29 in unison. In FIGS. 7a and 7c, these plates 29 are shown in close position. In FIG. 7b, they are shown in open position. In practice, this actuating mechanism can be located under the base 26 as shown or on top of the column holder 25.

A tube pusher mechanism 31 including two "flippers" 33 is mounted at the bottom of the column holder to push forwards one by one the stacked tubes held in the column holder of tubes. This mechanism 31 will be further described below.

Thus, the column holder 25 is essentially devised to retain the stacked tubes in the correct position while the tube pusher mechanism 31 pushes the tubes one by one from the bottom of the column into tube catching assemblies mounted on the rotatable barrel 39.

Figure 9A:
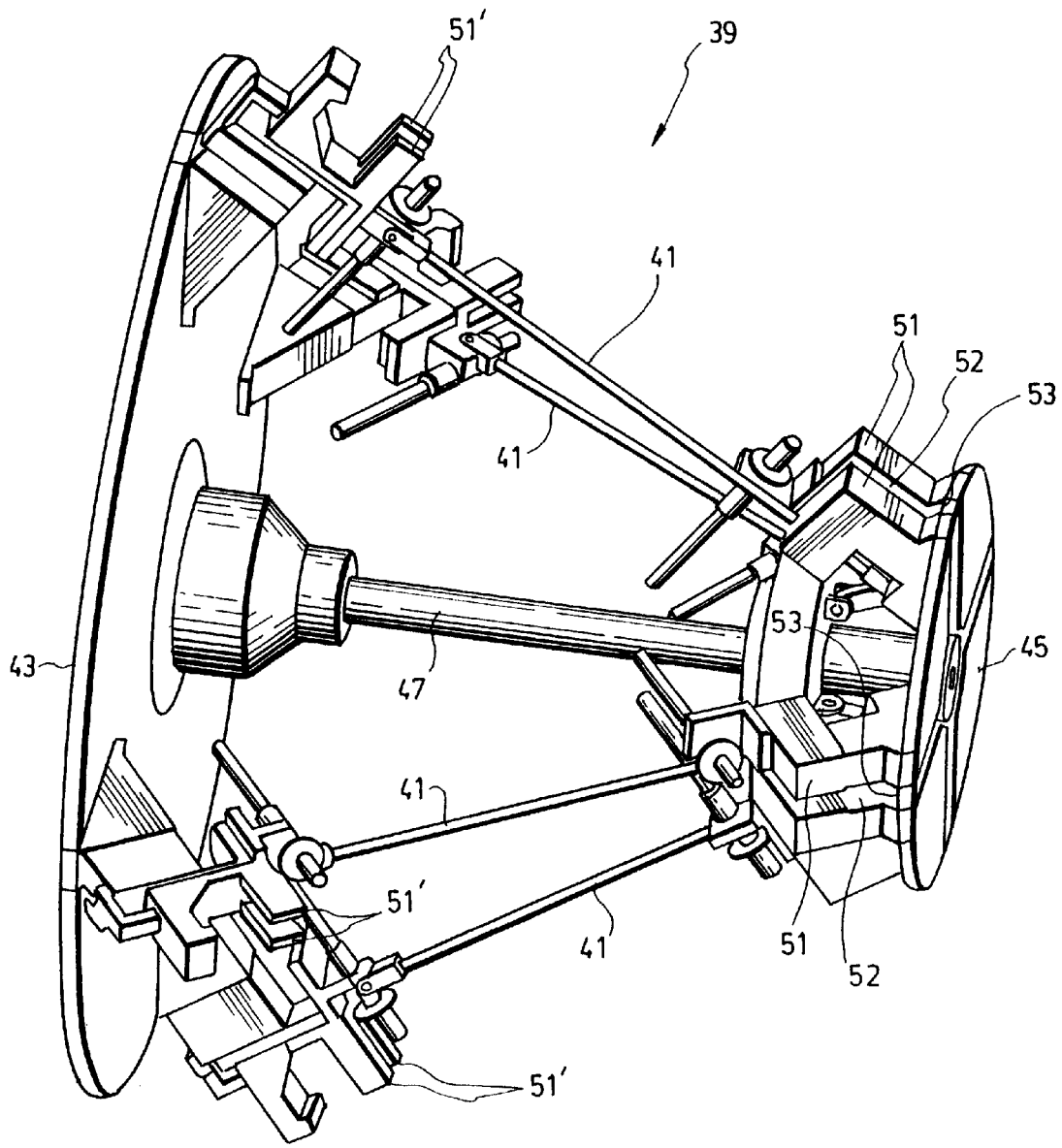
FIG. 9a is a perspective view of the barrel shown in FIG. 8.
Figure 9C:
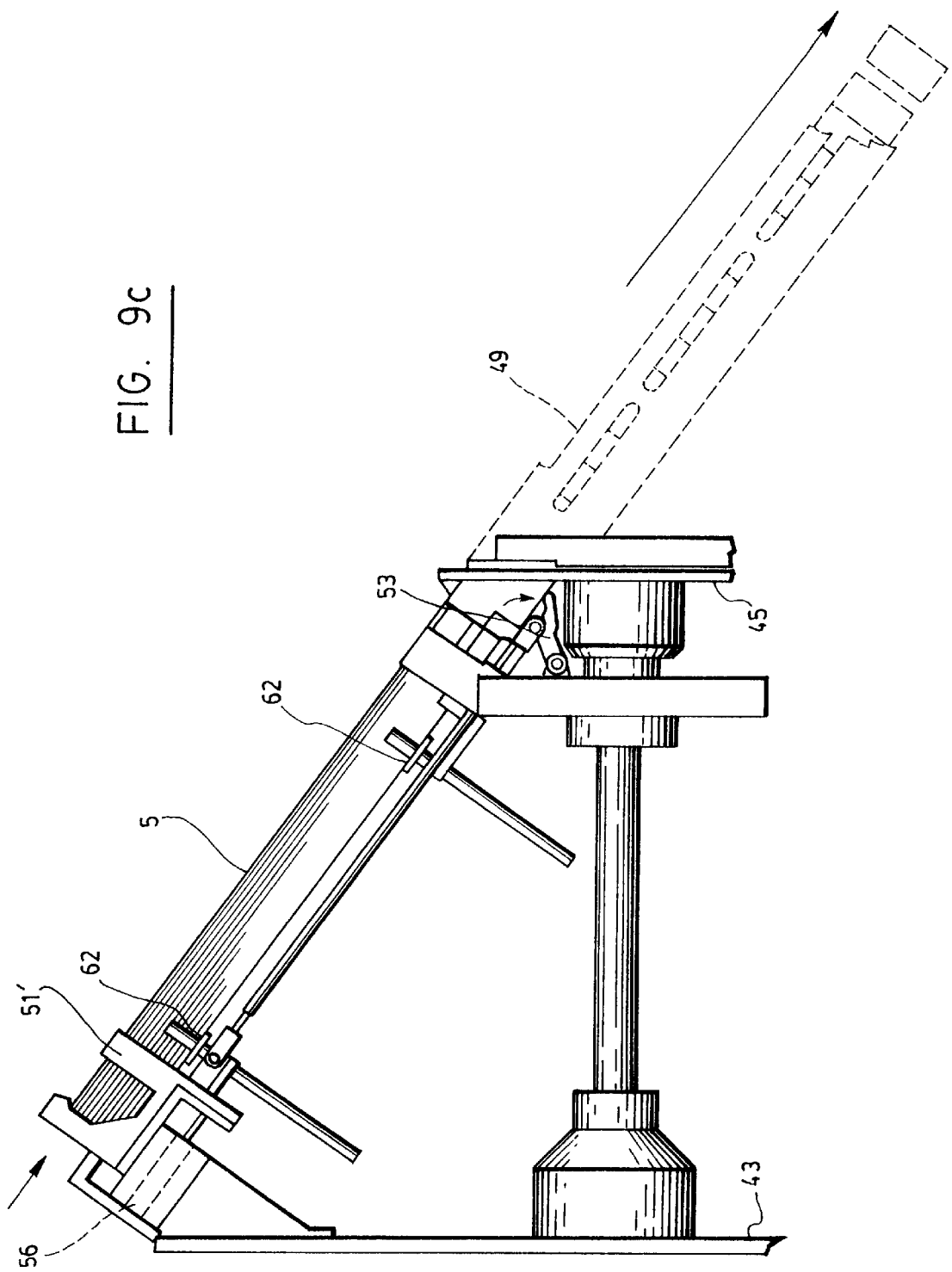
FIGS. 9b and c are partial side elevational views of the barrel shown in FIG. 9a, showing the one of the tube catching assembly with one tube on it before and after release of the clamping system used for closing the open and of the tube.
Figure 10:
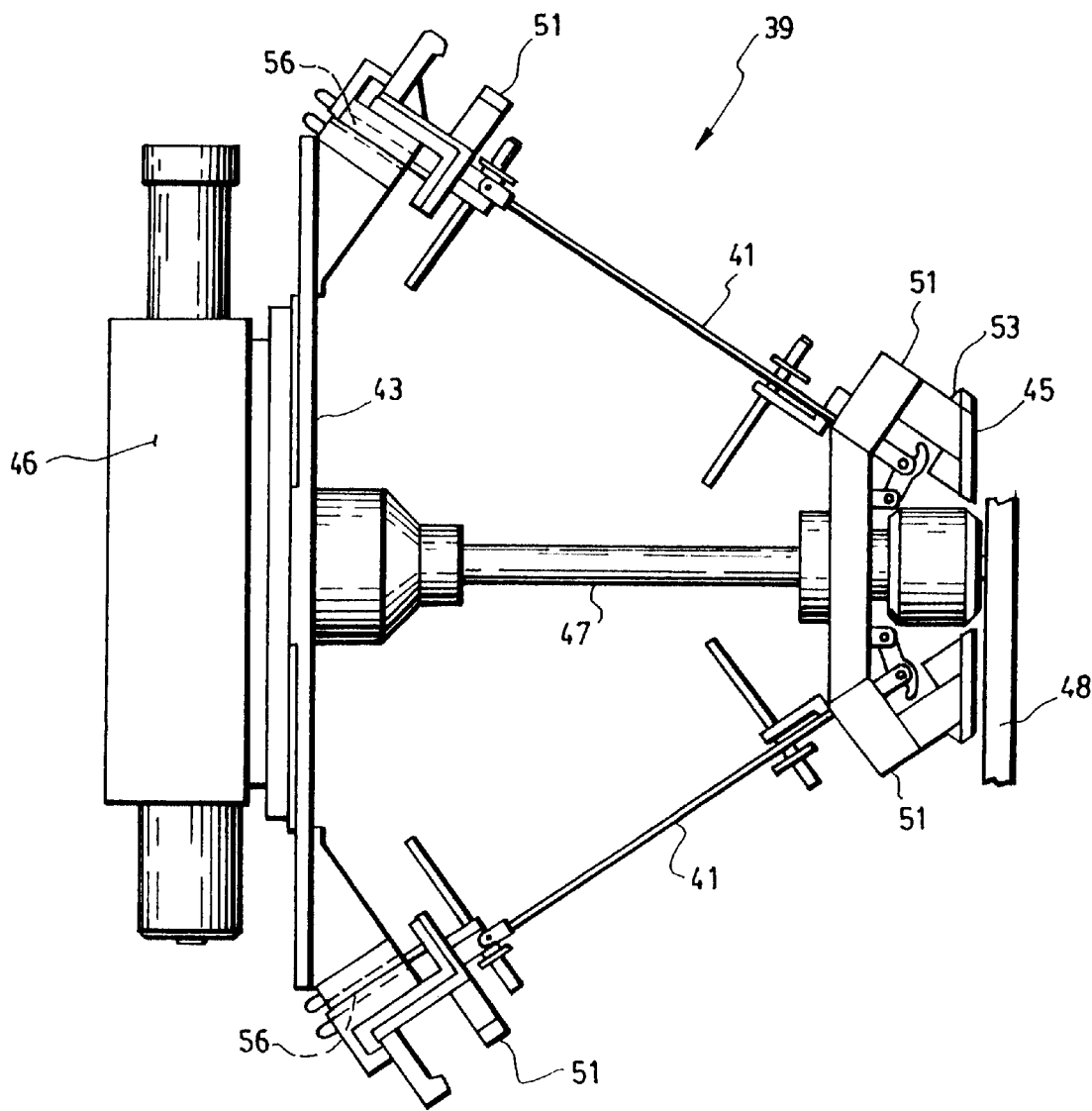
FIG. 10 is a cross-sectional view of the barrel shown in FIG. 9.

As is better shown in FIGS. 9a and 10, the rotatable barrel 39 is of conical shape. It comprises an axial spindle 47 supporting a set of tube-catching assemblies 41 that are equally spaced apart around it. Each of the tube-catching assemblies 41 extends along a generating line of the cone and is attached to a pair of end mounting plates 43, 45 that are rigidly connected to the axial spindle 47. As is clearly shown in FIGS. 1 and 8, the barrel is mounted on the frame so as to extend close to the rear side of the column holder 25 so that the axial spindle 47 extends horizontally and each of the tube catching assemblies 41 that move towards the column holder when the barrel is rotated in the direction shown with the arrow "R" passes through a horizontal loading position parallel and adjacent to the bottom end of this column holder.

In the illustrated embodiment, the number of catching assemblies is equal to four. However, it could be higher the only requirement for optimization of the operation of the whole system being that one of the catching assemblies be in the horizontal loading position while another assembly is a vertical inclined position.

A motor 46 (see FIG. 10) is operatively connected to the axial spindle 47 and a precision indexing table (not shown) is provided to rotate the barrel and properly position each of its catching assemblies 41 successively in said horizontal loading position, where it extends in parallel and adjacent relationship just in front of the bottom end of the column holder and the tube pusher mechanism 31. After a 90° rotation of the barrel, the catching assembly that was previously in the horizontal position is moved in the above mentioned vertical, inclined position where it extends in line with an inclined input accumulator that is located in the loading area of the component processing equipment (not shown) and is part of the same.

Each tube 5 pushed by the pusher mechanism 31 toward the barrel 39 is retained and supported by a pair of holding blocks 51, 51' that are parts of each catching assembly 41.

For this purpose, each block 51, 51' comprises a radially outwardly opened slot 52 sized to receive the corresponding portion of pushed tube 5.

As aforesaid, the pusher mechanism 31 comprising two flippers 33 that extend on top of the base 26 of the column holder 25. As is better shown in FIGS. 7a to 7e, each flipper 33 is pivotably mounted on vertical shaft 34 to which is connected a gear plate 38 actuated by two cylinders 37 connected to their gear plates 38 which are themselves in operative engagement so that they move in a synchronized fashion. Thus, when actuated, the flippers 33 of the pusher mechanism 31 push the tubes 5 laying onto the base 26 one by one into the barrel 39 while the same is rotating sequentially at 90°. In the meantime, the support assembly 17 may move back to its original position to receive from the column elevator 13 another column of stacked tubes to be unloaded. In use, a new column of tubes will be lifted and advanced into the holder 25 as soon as less than three tubes remain in the column holder.

After having been pushed one by one into the catching assemblies 41 of the barrel, the tubes are moved up and brought into alignment with the input accumulator of the component processing machine, in such a manner that all the components contained in each tube may slide down by gravity into the accumulator. In practice, the components are transferred from the tube 5 to the input accumulator of the equipment via a transition track 49 (see FIGS. 1, 9b and 9c). A sensing device (not shown) is located at the junction between this mounting plate 45 at the apex of the barrel and the track 49 to detect any component jam.

Of course, the frame and the barrel 39 must have a size, shape and position adapted to the size of the component processing equipment so that, in the vertical, inclined position, the open end of the inclined tube that is in a lower position, extends just in front of, and in line with, the loading area of this equipment. It is also compulsory that the tubes 5 be originally positioned in the MGM 3 and thereafter bring to the column holder 25 in such a manner that their open ends 6 extend close to the apex of the conical barrel. It is further compulsory that a clamping system be provided for closing at least in part the open ends 6 of the tubes 5 that are hold by the tube catching assemblies 41 so as to prevent the components from sliding out of the tubes 5 in which they are stored when the barrel is rotated and the catching assemblies 41 and tubes held by said assemblies are moved up. As is better shown in FIGS. 9a to 9c, the clamping system preferably comprises a set of fingers 53 pivotably mounted on the mounting plate 45 of the barrel. Each finger 53 is positioned so as to extend across the "outlet" of the slot 52 holding block 51 of the corresponding catching assembly 41 near the apex of the barrel so as to close the adjacent open end of the tube 5 held by the assembly. The opposite holding block 51' is mounted onto the opposite mounting plate 43 in such a manner as to be slidably moveable forward and backward towards the block 51 by means of a small cylinder 56 (see FIGS. 9b, 9c and 10). A joining rod 54 is operatively connected to the block 51' and to the finger 53.

As long as the barrel rotates, the block 51' is kept in rearward position. As a result, the finger 53 connected to the rod is kept vertically in the closing position as shown in FIG. 9b, where it prevents the components from sliding out of the tube 5. When the catching assembly 41 holding the tube 5 reaches the vertical, unloading position, then the cylinder 56 is actuated to push forward the block 51' and the tube 5 held by the same. This movement is simultaneously transferred by the rod 54 to the finger which is tilted down in the open position shown in FIG. 9c, thereby allowing the component to slide down out of the tube 5 into the track 49 leading to the component processing equipment. If desired, a wedge shaped tube opener (not shown) can be provided to ensure that the exit end of the tube is adequately open and thus that the components (TO's for example) may smoothly exit the tube.

Once the tube 5 in line with the track 49 and accumulator is empty, the barrel 39 rotates again at 90° to its next position, so that a next tube 5 may be emptied. At the same time, the empty tube is ejected into a chute 55 while another tube is loaded.

As is clearly shown in FIG. 1, the chute 55 is mounted on the frame close to the barrel 39 and opposite to the column holder 25. It is devised and positioned to collect the tubes 5 ejected from the tube catching assemblies 41 after they have been emptied.

To eject the tube 5, an ejecting system is operatively mounted on the barrel to push the tubes out of the slots 52 of the holding blocks 51', 51. This system preferably consists of two cylinders 60 forming part of each catching assembly 41 so as to extend radially outwardly in a direction perpendicular to the tube 5 (see FIGS. 9a to 9c). The piston of each cylinder 60 comprises a pushing ring 62 which, when the cylinder is actuated, comes into contact with the adjacent edge of the tube and pushes it out of the slots 52 of the holding blocks.

Referring again to FIG. 1, the chute 55 is in the form of a slide leading to a bin 57 for receiving the empty tubes. The slide has a trap door 58 actuated by a sensor (not shown) positioned to determine if any component remains in the tubes before they are ejected into the chute, so as to divert into another 50 bin any such tubes having components left therein.

An electronic control system 63 (see FIG. 1) operatively connected to a plurality of sensors is provided for actuating the motor 46, the cylinders of the tube pusher mechanism, the cylinder 56 of clamping system and the cylinders 60 of the ejecting system sequentially so that each of the stacked tubes 5 hold in the column holder 25 is caught by one of the tube catching assemblies 41, then moved to the vertical, inclined position and finally ejected into the chute 55. As can be understood, the control system 63 is also connected to the magazine conveyor 7, the column elevator 13, the support assembly 17 and actuating means of the column holder 25 so as to synchronize the operation of all these elements with each other and with the other elements of the device to continuously bring columns of tubes to the column holder 25 and then to the barrel 39 for allowing a continuous supply of tubes to the loading area of the component processing equipment.

In use, the accumulator of the components processing machine feeds the components received from the input tube handler to a conveyor (see the above mentioned Canadian patent and laid-open application). The components enter the accumulator through the track 49 and are then transferred to a stainless steel belt where they are presented to grippers which grasp and carry them through the machine. The belt conveyor mechanism may consist of a split stainless steel belt with a spring tensioner.

As can be understood, as soon as a MCM 3 has completely been emptied, the column elevator 13 is moved up and the conveyor 7 actuated to bring the empty MCM to an unloading dock 11 provided at the other end of the conveyor. This dock 11 is provided with another elevator which raises the empty MCM so that a trolley can be inserted. The empty MCM can then be lowered onto the trolley and removed from the magazine conveyor.

Once again, the electronic control system 63 ensures proper operation and synchronization of all these elements.

The input tube handler 1 according to the preferred embodiment of the invention disclosed hereinabove operates as follows.

Am amber light (not shown) is located above the loading dock 9 and blinks to indicate that it is OK to insert a trolley with a MCM 3. The trolley is wheeled into position above the loading dock 9 of the input transfer. Sensors detect both the trolley and the MCM in position while the amber light is steadily on, and instruct the loading dock to raise the MCM. A sensor detects the loading dock at the full up position and activates a green light located above the loading dock to indicate that it is OK to remove the trolley, which can then be wheeled out of its position above the loading dock. The MCM is now lowered by the loading dock onto the magazine conveyor 11, which advances the MCM at a rate of 20 ft per minute.

Once in close proximity to the column elevator 13, a sensor detects the MCM 3 and stops the conveyor 11, which now advances at 2 ft per minute. Another sensor detects a slot that is part of the MCM and whose purpose is to ensure that the MCM is at the first column position. Once this position is detected, the conveyor 11 stops and a sensor detects if tubes 5 are present in the first column position. If no tubes are detected, the MCM is advanced to the next column position. This cycle is repeated as necessary until tubes are detected.

Once tubes are detected, the column elevator 13 is actuated to lift a column tube into the column pusher 17. A sensor detects that the elevator is in the up position and actuates the tube holding plates 21 to move them under the column of tubes to support the stack. Another sensor detects that the tubes holding plates 21 have moved into the correct position. Then, the tube locking rods 23 are lowered to retain the stacked tube. A sensor confirms that the locking rods are in the down position, and another sensor confirms that all the tubes have been removed form the column of the MCM.

The elevator is now lowered down and a sensor confirms that the elevator is in its full down position.

During that time, a sensor determines if less than three tubes remain in the column holder 25. When less than three tubes remain, both retaining plate 29 are opened. A sensor confirms that the plates 29 are fully open and the column pusher 17 advances the stacked tube into the column holder 25. A sensor detects that the tube stack is fully advanced and both plates 29 are closed. The sensor then confirms that the plates 29 are fully closed and the tube locking rods are then retracted to their full up position. A sensor detects again that the rods have been fully retracted.

The column pusher 17 now returns to its original position and a sensor detects that it is in its original position. The tube supporting plates which supported the stacked tubes are now retracted and sensors confirm that the tube supports have been retracted.

As can be understood, the above sequence of steps has brought the tubes from the MCM to a position where they can be loaded into the barrel 39. The tubes are now ready to be advanced to the barrel.

It should be understood that during normal operation, many of the above and following steps are being executed simultaneously.

For the sake of clarify, it will be referred hereinafter to the four basic barrel positions as follows:

0 degrees—position where the tubes are loaded onto the barrel;

90 degrees—position where the components are released form the tube into the slide;

180 degrees—position where the tubes are ejected from the barrel;

270 degrees—empty position.

A sensor detects that tubes 5 are present in the column holder 25 and the barrel 39 has completed its motion. Then, the flippers 33 of tube pusher mechanism push the lowest tube into the holding blocks 51 of one of the assemblies of the barrel at the 0 degree position and then return to their original position. A sensor detects this original position. Then, the barrel is indexed at 90 degrees.

At 90 degrees, the clamping system is actuated to push down the tube 5 and to pivot the finger 53 in open position, whereby the tube 5 the components in the tube may slide into the track 49. At the very same time, at 0 degree, the process is repeated. The barrel is then indexed at another 90 degrees. At the 180 degree position, a sensor determines if the tube is empty. The tube is then ejected from the barrel 39 and routed to one of two bins 57, 59. At the end of the output chute, the empty tubes will drop into the primary bin 57. If it is determined that components remain in the tube 5, the trap door 58 will be actuated to divert the tube into the secondary bin 59. When the sensor determines the condition of the tube, the trap door is opened, or closed, and verified in the correct position as required to deliver the tube to the correct bin. At the 90 degree position, the previous step is repeated.

Concurrent with the ejection of the tube from the 180 degree position, the tube at the 90 degree position may be tapped with an air cylinder to dislodge any remaining components. Last of all, a sensor verifies that the tube has been ejected (checks both ends) in order to allow indexing to the next position.

As can be understood, the tube input handler 1 according to the invention is fully automated. It is very fast and efficient and, as aforesaid, may automatically feed up to 45,000 components into a component processing machine.

Of course, to take fully advantage of the automatic input tube handler, it is compulsory that an output tube handler 101 as fast and efficient as the input handler 1 be provided at the unloading area of the component processing machine in order to recover the processed components and load them back in the tube.

Figure 11:
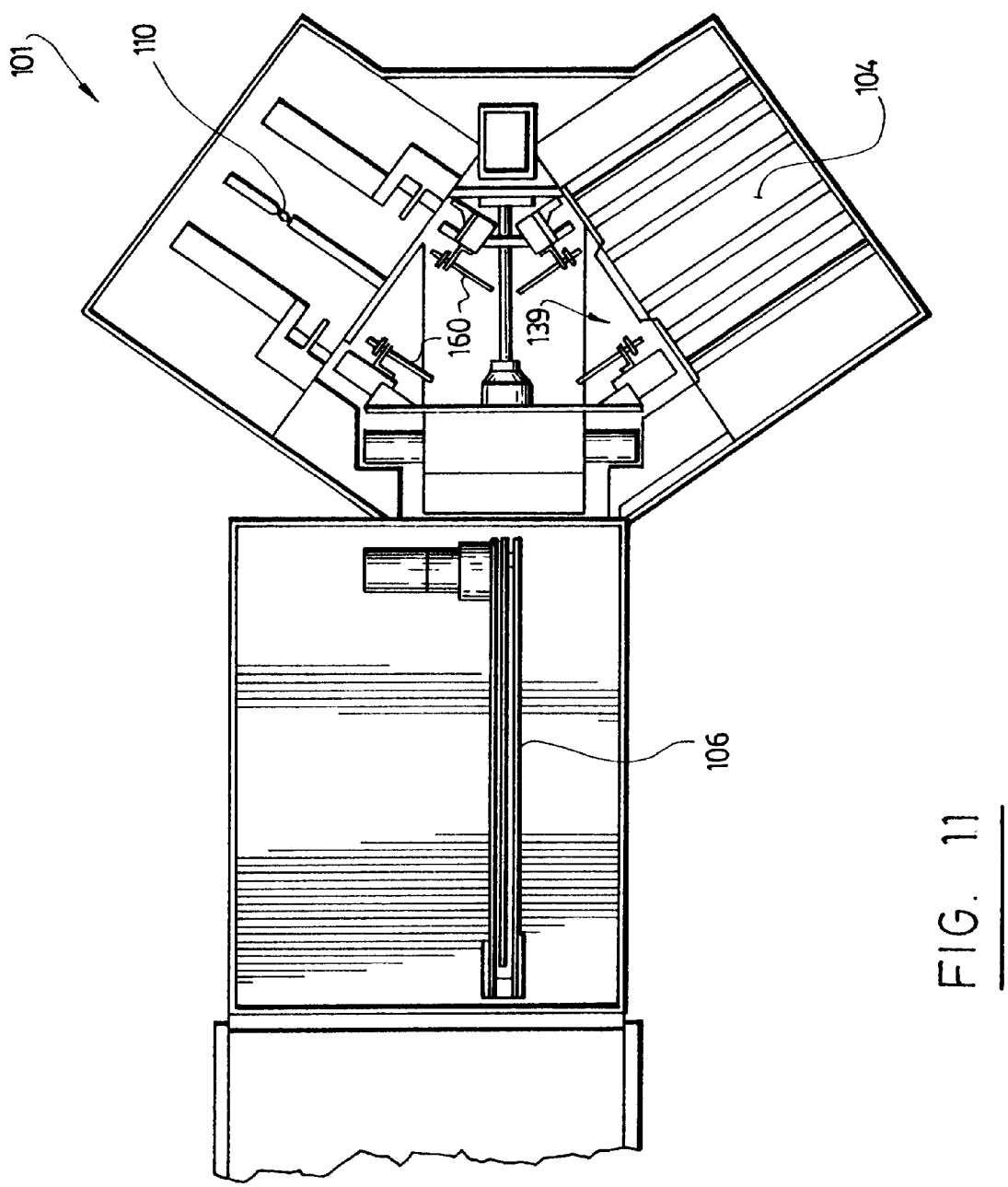
FIG. 11 is a top plan view of the unloading area of a component processing machine equipped with an automatic output tube handler according to a preferred embodiment of the invention, the barrel being shown in partial cross-section for clarification purpose.
Figure 12:
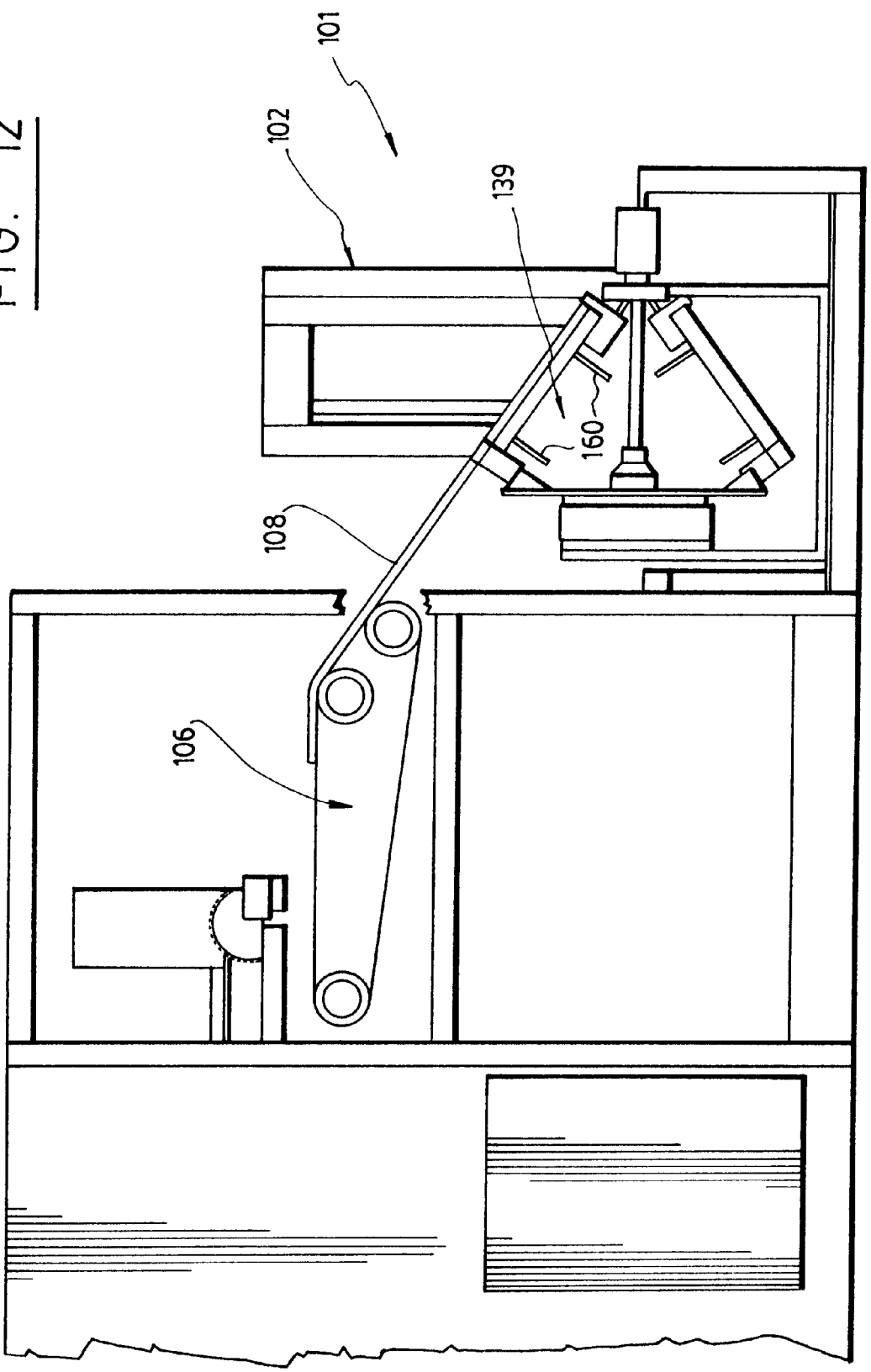
FIG. 12 is a side elevational view in partial cross-section of the automatic output tube handler shown in FIG. 11.

As is shown in FIGS. 11 and 12, the output tube handler 101 according to the preferred embodiment of the invention uses the same basic elements and design to handle the tubes in substantially the same way as the input tube handler 1 does.

A rotatable barrel 139 similar in shape, structure and operation to the barrel 39 handles the tubes for feeding therein the processed components. Because of this similarity, the structure of the barrel 139 and associated elements, especially its motor needs not be further described.

An operator places the empty tubes into an empty tube column holder 102 which holds the empty tubes horizontally for loading into the barrel. The column holder 102 is devised to receive two columns of empty tubes in parallel relationship. The first column acts as a primary column and the second column as a buffer. Empty tubes are placed in both columns. Once again, it is compulsory that all the open ends 6 of the tubes 5 be located on a same side which, in this particular case, must be opposite to the apex of the barrel. When a sensor detects a tube in the first column, an elevator will lower this first column and the tubes will be fed from there into the barrel. If no tubes are detected in the first column, then they will be fed from the second column. Whenever tubes are being fed from the second column, a pre-empty alarm will warn of the need to fill the first column. During the process, a thrubeam sensor verifies that the tubes are emptied before they are pushed into the barrel.

Each empty tube is pushed into the barrel 139 and clamped into position. The barrel is now indexed at 90 degrees to move the tube into a vertical inclined position. Of course, the frame and barrel 139 must again have a size, shape and position adapted to the size of the component processing equipment so that, in this vertical inclined position, the end of the inclined tube that is in an upper position, extends just in from of, and in line with, the unloading area of said equipment and the components coming from the unloading area are then free to slide down by gravity into the inclined tube and fill it up.

A "tube present" sensor (not shown) verifies that the tube is in position to receive the components. The components slide into the tube until the specified numbers have been counted.

A mechanically operated finger can be mounted at the unloading area of the processing equipment to prevent the processed components form moving out of the unloading area until an empty tube is positioned in the vertical inclined position. Instead of such a finger, use can be made of the adjacent surface of the mounting end 43 of the barrel 139 to retain the components.

After the tube 5 has been filled up, the barrel 139 is indexed at another 90 degrees. At the 180 degree position the tube is ejected by a set of cylinders 160. Sensors verify that the tube 5 has been properly ejected from the barrel, and the tube is pushed out onto an output chute 104. This output chute 104 comprises a flat anodized aluminium platen fitted with teflon strips to ease the sliding of the tubes when pushed out of the barrel, with two guides to align the tubes for pick up.

In use, an input transfer convenor 106 that is part of the component processing equipment receives components from the conveyor of the tinning machine and feeds them to the output tube handler. The grippers deposit the components onto an output conveyor belt and the components are carried to a slide 108. The components move down the slide and pass a thrubeam sensor that counts them as they enter a tube held in alignment by the barrel 139. Once the count reaches 20, a singulator (not shown) stops the flow of components and singulate five additional components into the aligned tube in order to avoid overshooting the count. When the tube is full (25 components), the singulator will stop feeding components until the full tube is replaced by an empty one. When the barrel indexes an empty tube into place, the singulator will release components automatically, and this singulator will release components automatically, and this cycle will repeat.

In use, the output tube handler 101 described hereinabove operates as follows.

An operator manually fills both the first and second columns of the column holder 102 with empty tubes. A reference notch can be made in the tubes to prevent it from being inserted into the column backwards. When a sensor detects tubes in the first column, the elevator will move them to a down position. A thrubeam sensor verifies that the tube is emptied before it is pushed into the barrel.

A tube pusher mechanism 110 (see FIG. 11) pushes the tube into the barrel at he 0 degree position. The barrel is then indexed at 90 degrees and a "tube present" sensor verifies that the tube is ion position to receive the processed components. The components slide into the tube until the specified number are counted. For this purpose, there is a sensor at the junction of the tube and the slide to detect any jam that might occur.

The barrel 139 is then indexed again at 90 degrees and the actions listed above repeat at the same positions. At the 180 degree position, the filled-up tube is ejected from the barrel 139 and pushed out into the chute 104. Two sensors verify that both ends of the tube are out of the barrel. Once again, the barrel is indexed at 90 degrees and the process is repeated.

Thus, as can be better understood, the tube output handler 101 is fully automated. It is fast and efficient and thus can complement the input tube handler 1.

Of course, numerous modifications could be made to the devices 1 and 101 disclosed hereinabove without departing from the scope of the invention as defined in the appended claims.

I claim:

1. A device for feeding components stored in tubes into a loading area of a component processing equipment, each of said tubes being straight and having a longitudinal axis and an open end, said device comprising:

a frame;

a column holder mounted on the frame for receiving and holding a column of tubes stacked one above the other with all their open ends on a same side of said column, each of said tubes extending horizontally and being filled with components to be fed into the loading area, said column holder having a front side, a rear side and a bottom end;

a rotatable barrel having a conical shape and an apex and comprising an axle spindle supporting a set of tube catching assemblies extending along generating lines of said conical barrel, said tube catching assemblies being equally spaced apart around the barrel and comprising holding blocks provided with radially outwardly opened slots, said barrel being mounted on the frame close to the rear side of the column holder so that the axial spindle extends horizontally and each of the tube catching assemblies moving towards the column holder when the barrel is rotated passes through an horizontal loading position parallel and adjacent to the bottom end of said column holder;

a motor operatively connected to the spindle for rotating the barrel to position successively each of the tube catching assemblies in said horizontal loading position just in front of the bottom end of the column holder and then to move up the catching assembly to a vertical, inclined position;

a tube pusher mechanism for pushing forwards the tube of the column of tubes extending at the bottom end of the column holder into the slots of the holding blocks of the tube catching assembly that has just been moved in the loading position, with the open end of said tube extending close to the apex of the conical barrel;

a clamping system for closing at least in part the open ends of the tubes that are held by the tube catching assemblies so as to prevent the components from sliding out of the tubes in which they are stored when the barrel is rotated and the catching assemblies and tubes held by said assemblies are moved up;

a chute mounted on the frame close to the barrel and opposite to the column holder for collecting the tubes from the tube catching assemblies after said tubes have been emptied and the barrel is further rotated to bring said tube catching assemblies to an unloading position;

an ejecting system operatively mounted on the barrel to push the tubes out of the slots of the tube catching assemblies into the chute when said tubes reach said chute; and a control system for actuating the motor, the tube pusher mechanism, the clamping system and the ejecting system sequentially so that each of the stacked tubes held in the column holder is caught by one of the tube catching assemblies, then moved to the vertical inclined position and finally ejected into the chute;

wherein the frame and barrel have a size, shape and position adapted to the size of the component processing equipment so that, in said vertical, inclined position, the open end of the inclined tube that is in a lower position, extends just in front of, and in line with, the loading area of said equipment, and the clamping system is then actuated to let the components stored in the inclined tube slide down by gravity into said loading area.

2. The device of claim 1, wherein the clamping system comprises a set of mechanically operated fingers mounted on the barrel in respective operational relationship with respect to the set of tube catching assemblies, said fingers when actuated closing the open ends of the tubes held by said catching assemblies.

3. The device of claim 2, wherein:

the chute is in the form of a slide leading to a bin for receiving the empty tubes; and said slide has a trap door actuated by a sensor positioned to determine if any component remains in the tubes dropped in the chute so as to divert into another bin any such tubes having components left therein.

4. The device of claim 1, further comprising:

a magazine conveyor extending under the column holder, the barrel and the chute, said conveyor receiving and carrying forward multicolumn magazines in which columns of tubes filled with components and stacked one above the other extend vertically in parallel relationship;

a column elevator mounted on the frame transversely to the conveyor, said elevator comprising a fork movable up and down for picking up one by one each of the columns of tubes contained in the magazines and for lifting up the so-picked-up column:

a support assembly movable forwards and rearwards for picking up the column lifted up by the column elevator and bringing it into the column holder, said support assembly being mounted on the fame and including a pusher plate extending vertically close to the front side of the column holder and transversely with respect to the conveyor; at least one horizontal holding plate at the bottom of the pusher plate for retaining the column of tubes lifted up by the column elevator with said column extending flat against the pusher plate and thus for allowing the column elevator to move down and pick up another column of tubes; and means to move the support assembly with the column of tube retained on it towards the column holder;

said column holder comprising two vertical members each of U-shaped cross-section that are spaced apart to receive in between the column of tube brought by the support assembly, each of said members having a rear wall in the form of a retaining plate pivotable about a vertical axis, said retaining plates acting as a column locking mechanism and being operatively connected to actuating means so as to swing between an open position where the support assembly may move forward and bring the column of tubes in between the vertical members, and a closed position where the column of tubes is locked;

said conveyor, column elevator, support assembly and actuating means of the column holder being connected to the control system and synchronized to work together in order to bring columns of tube in a continuous manner to the column holder and then to the barrel for continuously supplying the loading area of the processing equipment.

5. The device of claim 4, wherein:

said at least one holding plate of the support assembly is retractable to allow the column of tubes to slide against the pusher plate while said column is lifted up by the column elevator;

at least one vertical cylinder is mounted on the support assembly so as to extend on top of the column of tubes extending flat against the pusher plate and to apply a retaining pressure onto said column; and the pusher mechanism comprises two horizontal extending flippers that are joined by gear plates and actuated so as to move in a synchronized fashion.

6. The device of claim 5, wherein the clamping system comprises a set of mechanically operated fingers mounted on the barrel in respective operational relationship with respect to the set of tube catching assemblies, said fingers when actuated closing the open ends of the tubes held by said catching assemblies.

7. The device of claim 5, further comprising:

a loading dock elevator and an unloading dock elevator at both ends of the conveyor, respectively, so as to facilitate transfer of each magazine from a trolley to the conveyor and vice versa.

8. The device of claim 7, wherein:

the chute is in the form of a slide leading to a bin for receiving the empty tubes; and said slide has a trap door actuated by a sensor positioned to determine if any component remains in the tubes dropped in the chute so as to divert into another bin any such tubes having components left therein.

* * * * *